United States Patent [19]

Nojiri et al.

[11] Patent Number: 5,371,175
[45] Date of Patent: Dec. 6, 1994

[54] EPOXY-TERMINATED POLYAMIDE, ADHESIVE MADE THEREFROM AND METHODS FOR PRODUCING THEM

[75] Inventors: Hitoshi Nojiri; Katsunori Yabuta, both of Ohtsu, Japan

[73] Assignee: Kanegafuchi Kagaku Kogyo Kabushiki Kaisha, Osaka, Japan

[21] Appl. No.: 21,225

[22] Filed: Feb. 23, 1993

[51] Int. Cl.$^5$ .................. C08L 77/06; C08C 69/26
[52] U.S. Cl. .................. 528/335; 525/420.5; 525/423; 525/430; 525/452
[58] Field of Search .................. 525/423, 420.5, 430, 525/452; 528/335

[56] References Cited

U.S. PATENT DOCUMENTS

| | | | |
|---|---|---|---|
| 3,558,742 | 1/1971 | Schmid et al. | 525/423 |
| 3,657,380 | 4/1972 | Fang | 525/423 |
| 3,678,127 | 7/1972 | Schmid et al. | 525/423 |
| 3,734,887 | 5/1973 | Schmitt et al. | 525/423 |
| 5,055,530 | 10/1991 | Inoue | 525/423 |

FOREIGN PATENT DOCUMENTS

| | | |
|---|---|---|
| 0174225 | 3/1986 | European Pat. Off. |
| 0295906 | 12/1988 | European Pat. Off. |
| 0441545 | 8/1991 | European Pat. Off. |
| 0527548 | 2/1993 | European Pat. Off. |
| 52-068236 | 6/1977 | Japan |
| 61-188410 | 8/1986 | Japan |

*Primary Examiner*—John Kight, III
*Assistant Examiner*—P. Hampton-Hightower
*Attorney, Agent, or Firm*—Sughrue, Mion, Zinn, Macpeak & Seas

[57] ABSTRACT

An epoxy-terminated polyamide having the following structure:

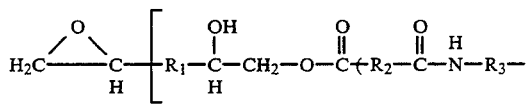
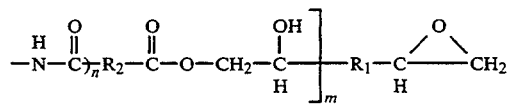

where each of $R_1$, $R_2$, and $R_3$ is a divalent organic group, and each of n and m is a natural number, and an adhesive containing the above epoxy-terminated polyamide, an epoxy resin and a curing agent. The epoxy-terminate polyamide is well compatible with epoxy resins and an adhesive containing the same is excellent in adhesiveness and thermal resistance.

22 Claims, No Drawings

EPOXY-TERMINATED POLYAMIDE, ADHESIVE MADE THEREFROM AND METHODS FOR PRODUCING THEM

BACKGROUND OF THE INVENTION

1. Field of the Invention

The present invention relates to an epoxy-terminated polyamide and an adhesive made therefrom. More particularly, the present invention relates to an epoxy-terminated polyamide, an adhesive made from it, and to methods for producing them. The epoxy-terminated polyamide of the present invention is suited for an amide component and well compatible with an epoxy resin in the production of an epoxy/polyamide adhesive which is excellent in adhesiveness and thermal resistant property and which is usefully available for substrates of flexible printed wiring boards mounting a variety of electric and electronic parts.

2. Description of the Prior Art

Conventionally, an epoxy-polyamide (nylon) type is well known for an adhesive which is excellent in adhesion and thermal resistant property and which is widely made available for a variety of substrates including flexible wiring boards and the like.

On the other hand, from the viewpoint of excessive hygroscopic property and insufficient thermal resistant property, use of a large amount of a polyamide resin against an epoxy resin is not recommended. Generally, a polyamide resin is not well compatible with an epoxy resin.

Therefore, the blend containing a large amount of an epoxy resin often results in poor uniformity in the dried condition, thus, this degrades reliability of adhesiveness and obstructs stable product quality.

SUMMARY OF THE INVENTION

Therefore, an object of the invention is to provide a novel epoxy-terminated polyamide which is well compatible with an epoxy resin and excellent in thermal resistant property, and also provides a method for producing it.

Another object of the invention is to provide a novel adhesive which is excellent in thermal resistant property and adhesiveness, and also provides a method for producing it.

To solve those problems mentioned above and to enhance freedom of blending a variety of epoxy resins and polyamide resins, the inventors have made an extensive study to improve compatibility of polyamide resins with epoxy resins, and finally found out that those technical problems mentioned above could be solved by using epoxy-terminated polyamides having a specific structure, thus having achieved the present invention.

DETAILED DESCRIPTION OF THE INVENTION

The first aspect of the present invention is to provide a novel epoxy-terminated polyamide having the following structure:

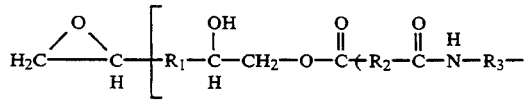

-continued

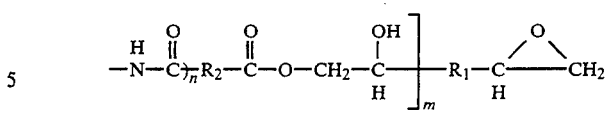

where each of $R_1$, $R_2$, and $R_3$ is a divalent organic group, and each of n and m is a natural number.

The second aspect of the present invention is to provide a method for producing a novel epoxy-terminated polyamide characterized by reacting an epoxy resin with a carboxylic acid-terminated polyamide, wherein the amount of the epoxy resin is substantially equivalent to that of the carboxylic acid of the polyamide.

The third aspect of the present invention is to provide a novel adhesive comprising the aforementioned epoxy-terminated polyamide, an epoxy resin, and curing agent for the epoxy resin.

The fourth aspect of the present invention is to provide a method for producing the above-identified adhesive comprising (1) an epoxy-terminated polyamide resin generated from the reaction of an epoxy resin with a carboxylic acid-terminated polyamide, wherein the amount of the epoxy resin is substantially equivalent to that of the carboxylic acid of the polyamide, (2) an epoxy resin having a structure identical to or different from that of the epoxy resin used for the reaction, and (3) a curing agent for the epoxy resin.

Characteristically, the present invention uses a polyamide resin containing epoxy groups at its terminals, which results in the improved compatibility of a polyamide resin with an epoxy resin so that both the epoxy resin and the polyamide resin can be used in combination with each other at a broader blend ratio, thus expanding freedom for designing physical properties. Furthermore, since polyamide terminals contain reactive groups, high quality adhesives having very high thermal resistant property can be obtained by the present invention.

The polyamide used in the present invention employs as a monomer a dicarboxylic acid such as adipic acid, sebacic acid, dodecan diacid, dimer acid, or the like. These acids may be used singly or in combination of two or more. Of these, the dimer acid generates a polyamide having low hygroscopic property, and is thus preferred. Meanwhile, a polyamide obtained by the use of the dimer acid is extremely poor in compatibility to epoxy resins, and thus, the present invention is capable of producing an epoxy-terminated polyamide which has both low hygroscopic property and excellent compatibility to epoxy resins. Insofar as unsaturated fatty acids are used as raw materials, any kind of dimer acids may be used, and it may contain monomer acids or trimer acids as well. The dimer acid may also be a hydrogenated dimer acid that contains saturated double bonds.

Diamines or diisocyanates reacted with the dicarboxylic acid include hexamethylene diisocyanate, toluene diisocyanate, diphenyl methane diisocynanate, isophorone diisocyanate, and diamines thereof. These may be used singly or in combination of two or more. However, in the light of excellent thermal resistant property and anti-hygroscopic property, use of diamines having the structure shown below is preferred:

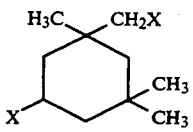

where X is NH₂ or NCO.

That is, the obtained polyamide has the following structure in its molecular structure:

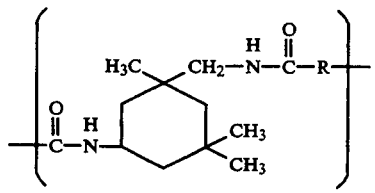

The polyamide desirably has a molecular weight of 1000–30000. If the molecular weight is below 1000, flexibility as a polyamide is not fully provided. Conversely, if the molecular weight is in excess of 30000, the reaction becomes difficult in epoxidizing a carboxylic acid-terminated polyamide, and yet, poor compatibility with an epoxy resin results.

As regards the epoxy resin reacted with a polyamide, a variety of epoxy resins may be used, including bisphenol A-type epoxy resins, bisphenol F-type epoxy resins, phenol-novolak type epoxy resins, cresol-novolak type epoxy resins, glycidyl ether type epoxy resins, naphthalene-type epoxy resins, or the like. However, in order to properly control the reaction, it is preferred to use bifunctional epoxy resins containing two epoxy groups in each molecule. These epoxy resins may be used singly or in combination of two or more.

Furthermore, the epoxy resin reacted with the polyamide may have a composition identical to or different from the compatible epoxy resin which makes up the main component of an adhesive of the present invention. However, in order to enhance the compatibility with each other, it is desired that the epoxy resins have a composition similar to each other.

It is desired that the reaction ratio between the polyamide and the epoxy resin reacted therewith ranges from 1:2 to 30:31. If the reaction ratio exceeds 30:31, the reaction hardly takes place. Furthermore, this causes the molecular weight to be too high, which lowers compatibility and solubility of the polyamide with the epoxy resin to merely result in difficult handling.

The carboxylic acid-terminated polyamide is generated from a diamine by adding an excess amount of carboxylic acid to diamine by a conventional method. On the other hand, the carboxylic acid-terminated polyamide is generated from a diisocyanate by adding a substantially equal amount of diisocynate to carboxylic acid in the presence of an organic solvent like N-methylpyrrolidone (NMP) or dimethylformamide (DMF), then conducting the reaction under heated conditions.

The epoxy-terminated polyamide is generated by adding an epoxy resin to a carboxylic acid-terminated polyamide in an amount substantially equivalent to that of the carboxylic acid of the polyamide in the presence of an organic solvent like toluene, chlorobenzene, or N-methyl-2-pyrrolidone, then conducting the reaction under heated conditions. It is preferred that the natural number n is in a range of from 1 to 40 and the other natural number m is in a range of from 1 to 30 in the above structure.

When using an amine-terminated polyamide, a secondary amine generated from the reaction with an epoxy resin reacts further with an epoxy resin to generate a tertiary amine which accelerates the reaction between an epoxy resin and an amine to merely complicate the reaction beyond control. To avoid this, it is essential that carboxylic acid-terminated polyamides should be used for synthesizing epoxy-terminated polyamides.

The adhesive of the present invention comprises the above-mentioned epoxy-terminated polyamide resin blended with a suitable amount of an epoxy resin and a curing agent for the epoxy resin. The preferable blend ratio is 10–70 parts by weight of the epoxy-terminated polyamide resin and 90 - 30 parts by weight of the epoxy resin. The curing agent is added in an effective amount depending on the kind of the epoxy resin and curing agent. If the epoxy-terminated polyamide resin is less than 10 parts by weight, the resultant adhesive is devoid of flexibility. On the other hand, if it exceeds 70 parts by weight, adhesiveness at a high temperature is degraded.

The curing agent for epoxy resins is not particularly limited, for example, including aliphatic polyamines, aromatic polyamines, secondary or tertiary amines, organic acid anhydrides, imidazoles, dicyandiamides, polymercaptans, novolak resins, or the like. These may be used singly or in combination of two or more.

The adhesive of the present invention may further contain ingredients other than those three components described above, for example, including acrylic resins, phenolic resins, imide resins, rubber-like resins, curing accelerators and curing catalysts for epoxy resins, inorganic and organic fillers. From the viewpoint of workability, it is preferred that those ingredients should be dissolved in an organic solvent before use.

It is essential that solvents are capable of dissolving both the epoxy and polyamide resins. The organic solvent includes methyl ethyl ketone, toluene, chlorobenzene, trichlorethylene, methylene chloride, methyl cellosolve, ethyl cellosolve, dimethylformamide, dimethylacetoamide, methanol, ethanol, isopropyl alcohol, or the like. These solvents may be optionally mixed according to the composition of the adhesives. For example, mixed solvents of methyl ethyl ketone/isopropyl alcohol being 1:1, toluene/methanol being 1:1, or the like may be employed.

The present invention will be explained in more detail by way of examples, but the present invention is in no way limited thereto.

In the following description, "parts" and "%" mean "parts by weight" and "% by weight" unless otherwise specified.

COMPARATIVE EXAMPLE 1

60 parts of an epoxy resin "EPIKOTE 1001" (trade name of YUKA-SHELL EPOXY CO., LTD.), 40 parts of an alcohol-soluble dimer acid polyamide (M.W 2000), 5 parts of dicyandiamide, 120 parts of toluene, and 120 parts of isopropyl alcohol were mixed and adequately stirred to thus prepare an adhesive solution. The so prepared adhesive solution was applied onto a polyimide film to a thickness of 20 μm after drying, and dried at 120° C. for 1 minute. The surface of the adhesive was observed with the naked eyes and violent phase separation was found.

Next, a copper foil having a thickness of 35 μm was superposed on the layer of the adhesive and laminated at 120° C. The laminate was heated at 180° C. for 3 hours to cure the layer of the adhesive to thereby produce a polyimide film/copper foil laminate (FCCL).

In accordance with JIS C-5016, the peeling strength was measured. The peeling strength value noticeably fluctuated between 0.8–1.4 kgf/cm at 23° C. but was rated to be 0.5 kgf/cm at 100° C.

COMPARATIVE EXAMPLE 2

30 parts of an epoxy resin "EPIKOTE 828" (trade name of YUKA-SHELL EPOXY CO., LTD.), 70 parts of alcohol-soluble dimer acid polyamide (M.W 2000), 3 parts of dicyandiamide, 120 parts of toluene, and 120 parts of isopropyl alcohol were mixed and then adequately stirred to thus prepare an adhesive solution. Next, a polyimide film/copper foil laminate (FCCL) was obtained by the same process as in Comparative Example 1, and the peeling strength was measured. The peeling strength values were 1.5 kgf/cm at 23° C., and 0.5 kgf/cm at 100° C.

EXAMPLE 1

A: Synthesis of carboxylic acid-terminated polyamide 40 grams of dimer acid (including 1% of trimer) and 120 grams of NMP were charged into a flask furnished with a stirrer and a reflux condenser and dissolved with stirring. Next, 14 grams of isophorone diisocyanate were added and the system heated at 100° C. for an hour, 150° C. for 3 hours, and at 200° C. for 2 hours to conduct the reaction. Then, NMP was removed by distillation from the reacted solution to thus synthesize a carboxylic acid-terminated polyamide.

B: Synthesis of epoxy-terminated polyamide 26 grams of carboxylic acid-terminated polyamide (M.W. 5500) obtained in the above A, 6.0 grams of an epoxy resin "EPIKOTE 1001" (trade name of YUKA-SHELL EPOXY CO., LTD), 120 grams of chlorobenzene, and 2.0 ml of triethylamine were charged into a flask furnished with a stirrer and a reflux condenser, and then refluxed at 140° C. for 10 hours to thus conduct the reaction. Then, chlorobenzene and triethylamine were removed by distillation from the reacted solution to thereby synthesize an epoxy-terminated polyamide.

C: Preparation of an adhesive 60 parts of an epoxy resin "EPIKOTE 1001", 40 parts of an epoxy-terminated polyamide obtained in the above B, 5.0 parts of dicyandiamide, 80 parts of toluene, and 80 parts of isopropyl alcohol were mixed and then adequately stirred to thus prepare an adhesive solution. Next, the obtained adhesive solution was applied and dried in the same way as in Comparative Example 1. The surface of the dried adhesive was observed with the naked eyes. It was found uniform and phase separation could not be observed. After obtaining a polyimide film/copper foil laminate in the same way as in Comparative Example 1, peeling strength was measured. It was 2.4 kgf/cm at 23° C., and 1.3 kgf/cm at 100° C.

EXAMPLES 2–4

Except for the changes shown in Table 1, a carboxylic acid-terminated polyamide and an epoxy-terminated polyamide were synthesized and an adhesive solution was prepared in the same way as in Example 1. Then, peeling strength was measured as in Example 1.

Table 1 shows the amount (grams) of a polyamide and an epoxy resin used for synthesizing an epoxy-terminated polyamide in Examples 1–4, the amount (grams) of ingredients of an adhesive containing the synthesized epoxy-terminated polyamide, and the peeling strength rated at 23° C. and 100° C.

TABLE 1

| Examples | 1 | 2 | 3 | 4 |
|---|---|---|---|---|
| Synthesis of epoxy-terminated polyamide | | | | |
| Polyamide | | | | |
| M.W. 2000 | | 20 | 39 | |
| M.W. 5500 | 26 | | | |
| M.W. 13000 | | | | 40 |
| Epoxy resin "EPIKOTE 1001" | 6 | 11 | 20 | 6 |
| Composition of adhesive | | | | |
| Epoxy-terminated polyamide | 40 | 40 | 40 | 40 |
| Epoxy resin | | | | |
| "EPIKOTE 1001" | 60 | 50 | 50 | 60 |
| Cresol-Novolak | | 10 | 10 | |
| Dicyandiamide | 5 | 5 | 5 | 5 |
| Peeling strength (kgf/cm) | | | | |
| 23° C. | 2.4 | 2.6 | 2.8 | 2.5 |
| 100° C. | 1.3 | 1.6 | 1.7 | 1.6 |

According to the present invention, epoxy-terminated polyamides having an improved compatibility with epoxy resins can be provided, and at the same time, adhesiveness and thermal resistance of epoxy/polyamide adhesives can be enhanced.

What is claimed is:

1. An epoxy-terminated polyamide for use in adhesives having the following structure:

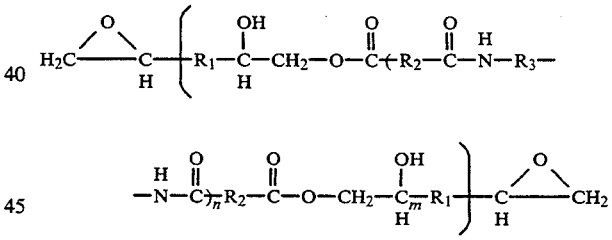

where $R_1$, $R_2$, and $R_3$ each represents a divalent organic group, and n and m each represents a natural number greater than zero.

2. The epoxy-terminated polyamide as defined in claim 1, wherein the polyamide contains the following structure:

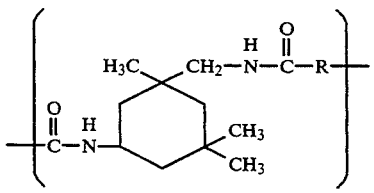

where R is a residual group of a divalent dicarboxylic acid.

3. The epoxy-terminated polyamide as defined in claims 1 or 2, wherein the polyamide has a weight average molecular weight of from 1000 to 30,000.

4. A method for producing an epoxy-terminated polyamide, for use in adhesives comprising the step of reacting an epoxy resin with a carboxy group-terminated polyamide in an amount substantially equivalent to that of carboxylic acid thereof.

5. The method as defined in claim 4, wherein the polyamide is made from a dimer acid as a raw material.

6. The method as defined in claim 5, wherein the polyamide contains the following structure:

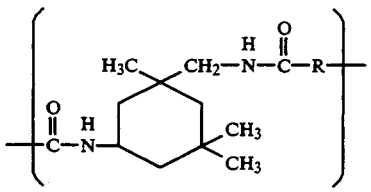

where R is a residual group of a divalent dicarboxylic acid.

7. The method as defined in claim 4, 5 or 6, wherein the polyamide has a weight average molecular weight of from 1000 to 30,000.

8. The epoxy-terminated polyamide as defined in claim 1, wherein $R_1$ and $R_2$ each represents a divalent residual group of a dicarboxylic acid and $R_3$ represents a divalent residual group of a diamine or diisocyanate.

9. The epoxy-terminated polyamide as defined in claim 8, wherein the dicarboxylic acid is selected from the group consisting of adipic acid, sebacic acid, dodecon diacid, dimer acid and combinations thereof.

10. The epoxy-terminated polyamide as defined in claim 8, wherein $R_3$ represents a divalent residual group of a diamine.

11. The epoxy-terminated polyamide as defined in claim 10, wherein the diamine has the following structure:

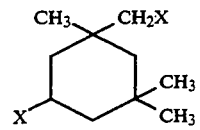

where X is $NH_2$ or NCO.

12. The epoxy-terminated polyamide as defined in claim 8, where $R_3$ represents a divalent residual group of a diisocyanate.

13. The epoxy-terminated polyamide as defined in claim 12, wherein the diisocyanate is selected from the group consisting of hexamethylene diisocyanate, toluene diisocyanate, diphenyl methane diisocyanate, isophorone diisocyanate, diamines of the foregoing diisocyanates and mixtures thereof.

14. The epoxy-terminated polyamide as defined in claim 8, wherein n is from 1 to 40.

15. The epoxy-terminated polyamide as defined in claim 8, wherein n is from 1 to 40 and m is from 1 to 30.

16. The method as defined in claim 4, wherein the epoxy resin is selected from the group consisting of bisphenol A epoxy resin, bisphenol F epoxy resin, phenol-novolak epoxy resin, cresol-novolak epoxy resin, glycidyl ether epoxy resin and naphthalene epoxy resin.

17. The method as defined in claim 4, wherein the epoxy resin is a bifunctional epoxy resin containing two epoxy groups per molecule.

18. The method as defined in claim 4, wherein the epoxy resin and carboxy group-terminated polyamide are reacted in a ratio of 1:2 to 30:31.

19. The method as defined in claim 4, wherein the epoxy resin and carboxy group-terminated polyamide are reacted in the presence of an organic solvent.

20. The method as defined in claim 19, wherein the organic solvent is selected from the group consisting of toluene, chlorobenzene and N-methyl-2-pyrrolidone.

21. The method as defined in claim 4, further comprising the step of heating the epoxy resin and the carboxy group-terminated polyamide while reacting the epoxy resin with the carboxyl group-terminated polyamide.

22. The method as defined in claim 21, wherein the heating step comprises heating the epoxy resin and the carboxy group-terminated polyamide at 100° C. for one hour, followed by heating at 150° C. for three hours, and followed by heating at 200° C. for two hours.

* * * * *

UNITED STATES PATENT AND TRADEMARK OFFICE
CERTIFICATE OF CORRECTION

PATENT NO. : 5,371,175
DATED : December 6, 1994
INVENTOR(S) : Nojiri et al

It is certified that error appears in the above-indentified patent and that said Letters Patent is hereby corrected as shown below:

Column 2, line 63, delete "diphenyl methane diisocynanate" and insert therefor --diphenyl methane diisocyanate--.

Column 3, line 57-58, delete "N-methylpyrrolidone" and insert therefor --N-methyl-2-pyrrolidone--.

UNITED STATES PATENT AND TRADEMARK OFFICE
CERTIFICATE OF CORRECTION

PATENT NO.    : 5,371,175
DATED         : December 6, 1994
INVENTOR(S)   : Nojiri et al Page 2 of 3

It is certified that error appears in the above-indentified patent and that said Letters Patent is hereby corrected as shown below:

Column 6, lines 36 to 48, which are lines 3 and 4 of claim 1, delete

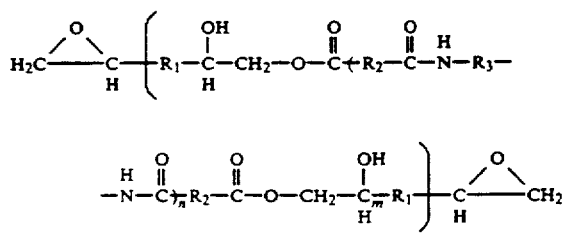

UNITED STATES PATENT AND TRADEMARK OFFICE
CERTIFICATE OF CORRECTION

PATENT NO. : 5,371,175
DATED : December 6, 1994
INVENTOR(S) : Nojiri et al

Page 3 of 3

It is certified that error appears in the above-indentified patent and that said Letters Patent is hereby corrected as shown below:

and insert therefor

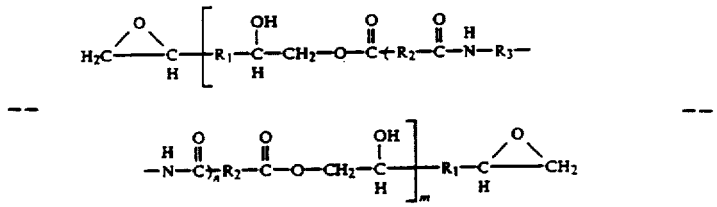

-- --

Column 7, line 3 and column 8, lines 31, 34, 40-41 and 46, delete "carboxy group" and insert therefor --carboxyl group--.

Signed and Sealed this

Fifteenth Day of October, 1996

Attest:

BRUCE LEHMAN

Attesting Officer

Commissioner of Patents and Trademarks